United States Patent [19]
Stern et al.

[11] Patent Number: 6,147,389
[45] Date of Patent: Nov. 14, 2000

[54] IMAGE SENSOR PACKAGE WITH IMAGE PLANE REFERENCE

[75] Inventors: Jonathan Michael Stern, Newport Beach; Itzhak Sapir, Irvine; William B. Hornback, Trabuco Canyon, all of Calif.

[73] Assignee: Silicon Film Technologies, Inc., Irvine, Calif.

[21] Appl. No.: 09/362,507

[22] Filed: Jul. 27, 1999

Related U.S. Application Data

[60] Provisional application No. 60/137,762, Jun. 4, 1999.

[51] Int. Cl.[7] .......................... H01L 31/0203; H01L 23/56
[52] U.S. Cl. ............................................ 257/434; 257/432
[58] Field of Search ..................... 257/434, 432, 257/684

[56] References Cited

U.S. PATENT DOCUMENTS

| | | |
|---|---|---|
| 4,926,227 | 5/1990 | Jensen . |
| 5,122,561 | 6/1992 | Tamura et al. . |
| 5,359,208 | 10/1994 | Katsuki et al. . |
| 5,867,368 | 2/1999 | Glenn . |

*Primary Examiner*—Stephen D. Meier
*Attorney, Agent, or Firm*—Knobbe, Martens, Olson & Bear, LLP

[57] ABSTRACT

An integrated circuit package that provides a reference plane relative to an image plane of an image sensor is described. The reference plane is aligned with respect to the image plane of the sensor such that the sensor can be mounted in an optical assembly quickly, easily, accurately, and inexpensively. The package can be thin, allowing for use of the package in retrofit applications such as using the packaged image sensor in a conventional 35 mm camera. The package includes a standoff frame for mounting a transparent window. The package includes reference members, such as rails, that define the reference plane. The package provides a desired tolerance between the reference plane and image plane of the sensor when the sensor is bonded into the package. The window can be flat or configured as a lens to focus the image on the image plane. The window can be configured such that its front (outer) face becomes the image plane of the packaged image sensor.

15 Claims, 13 Drawing Sheets

IMAGE SENSOR PACKAGE WITH IMAGE PLANE REFERENCE

REFERENCE TO RELATED APPLICATION

The present application claims priority benefit under 35 U.S.C. 119(e) from U.S. Provisional Application No. 60/137,762, filed Jun. 4, 1999, titled "IMAGE SENSOR PACKAGE WITH IMAGE PLANE REFERENCE."

BACKGROUND OF THE INVENTION

1. Field of the Invention

The invention relates to techniques for packaging solid state image sensors.

2. Description of the Related Art

Packaging of optical sensor integrated circuits has generally been accomplished using standard techniques for packaging integrated circuit dies. The integrated circuit die is placed in a cavity in a plastic or ceramic housing; wire bonding is typically used to make electrical connections to the die; and a window is placed (or molded) over the cavity. When placed in an optical system, the location and attitude of the package may readily be determined, but this is of little assistance in determining the location and attitude of the die (the top surface of the die should typically be coincident with the focal plane of the optical system) because package tolerances lack the requisite precision and because the package does not provide a reference surface positioned accurately with respect to the die. Each packaged sensor die must be separately focused to its optical assembly. Separate focusing is an expensive and error-prone process.

SUMMARY OF THE INVENTION

The present invention solves these and other problems by providing an integrated circuit package that defines a reference plane. During the packaging process, the reference plane of the package is aligned with respect to an image plane of the sensor such that the sensor can be mounted in an optical assembly quickly, easily, accurately, and inexpensively. In one embodiment, the package is thin, allowing for use of the package in retrofit applications such as using the packaged image sensor in a conventional 35 mm camera.

In one version, the package includes two frames, a first (e.g. lower) frame and a second (i.e., upper frame), bonded together. The lower frame is configured as a main housing with wiring traces on a front side and an opening with a recessed shelf for receiving a recessed cover on a rear side. The upper frame is configured as a standoff for a transparent window that allows light to reach the image sensor die. In one embodiment, the upper frame provides a die-positioning surface. The image sensor die, bonded to a generally rigid plate (e.g., a metal plate), is inserted from the lower side. The rigid plate functions as a back cover. Die positioning is provided by the die being stopped at the die-positioning surface created by the upper frame. In one version, a gap is provided between the rigid plate and the lower frame, and an adhesive is provided in the gap to hold the die and plate in place. The adhesive can be, for example, an epoxy adhesive, an elastomeric adhesive, a resin adhesive, a cyano-acrylate adhesive, etc. Reference members, such as, for example, rails, are provided. The reference members may be formed integrally with the upper frame or attached to the upper frame. The reference members define a reference plane.

In one version, the reference plane is offset by a fixed distance from the image plane (e.g., top surface) of the image sensor die. The tolerance between the reference plane and the image plane of the die is provided primarily by the mechanical tolerance between two surfaces of the upper frame. In one version, tolerance between the reference plane and the image plane of the die is provided by machining the reference members after bonding the plate to the lower frame.

In one version, the package includes a frame having an upper surface and a lower surface. A portion of the upper surface is configured with wiring traces. The lower surface is configured with a recessed shelf for receiving a recessed cover on a rear side. A portion of the upper surface is also configured as a standoff for a transparent window that allows light to reach the image sensor die. A portion of the lower surface provides a die-positioning surface. The image sensor die, bonded to a generally rigid plate (e.g., a metal plate) is inserted from the lower side. The rigid plate functions as a back cover. Vertical die positioning is provided by the die being stopped by the die-positioning surface. In one version, a gap is provided between the rigid plate and the lower surface, and the adhesive is provided in the gap to hold the die and plate in place. A portion of the upper surface is configured as one or more reference members. The reference members define a reference plane. In one version, tolerance between the reference plane and the image plane of the die is provided by a mechanical tolerance between the reference members and the lower surface. In one version, mechanical tolerance between the reference plane and the image plane of the die is provided by machining the reference members after bonding.

In one version, the window is configured as a lens to focus the image on the image plane of the die. In one version, the window is configured such that the front (outer) face of the window becomes the image plane of the packaged image sensor.

In one embodiment, an additional rear cover is bonded to the package. In one embodiment, there is a gap between the additional rear cover and the plate bonded to the die.

BRIEF DESCRIPTION OF THE DRAWINGS

The various features of the invention will now be described with reference to the following drawings.

In the drawings, like reference numbers are used to indicate like or functionally similar elements. The first digit of each three-digit reference number generally indicates the figure number in which the referenced item first appears.

DETAILED DESCRIPTION OF THE PREFERRED EMBODIMENT

Figure 1:
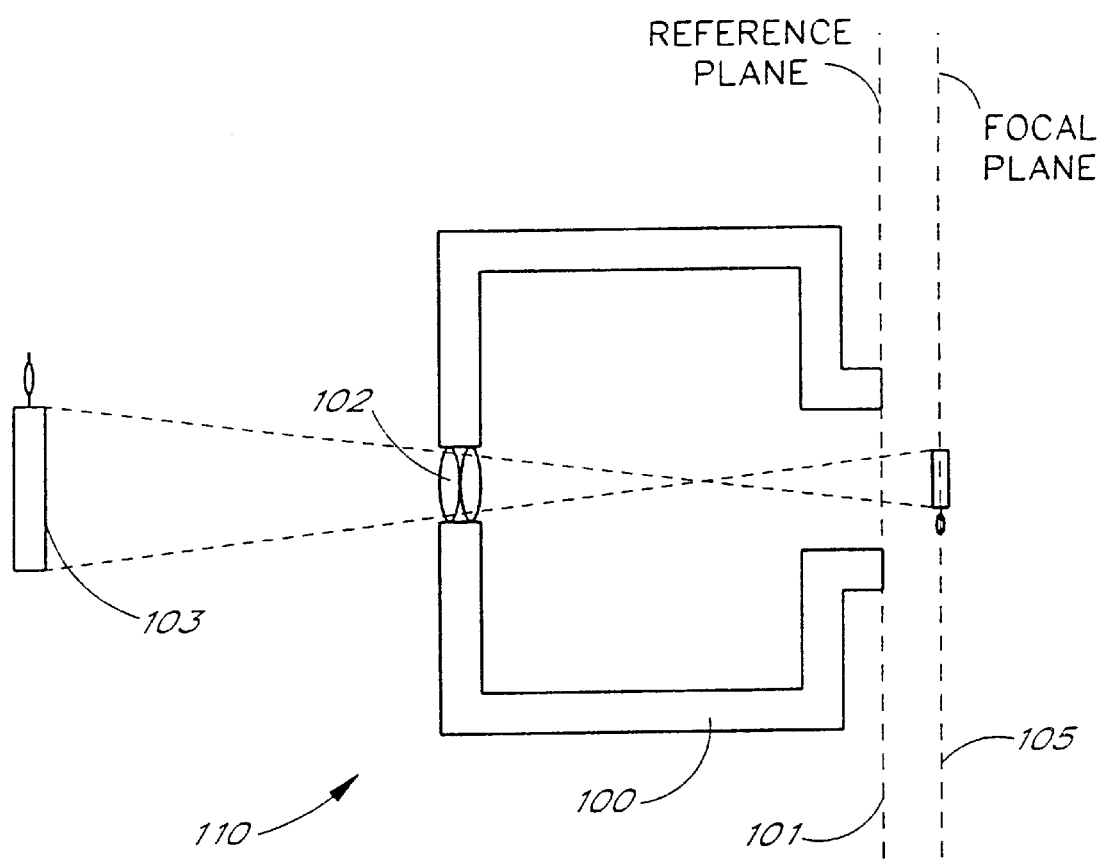
FIG. 1 shows an imaging system having a reference plane and a focal plane.

FIG. 1 shows an imaging system 110 having a reference plane 101 and a focal plane 105. The focal plane corresponds to the focal plane of a lens 102. The lens 102 is attached to a housing assembly 100, where a portion of the housing assembly 100 defines the reference plane 101. The lens 102 focuses an image of an object 103 onto the focal plane 105. In some optical systems, the focal plane 105 lies behind the reference plane 101. In other optical systems, the focal plane 105 lies in front of the reference plane 101. In yet other optical systems, the focal plane 105 is coincident with the reference plane 101.

The imaging system 110 is typical of cameras where the housing assembly 100 corresponds to the camera body and the lens 102 corresponds to the camera lens. In a typical film camera (e.g., a 35 mm camera, a large-format camera, a view camera, etc.) the film is pressed against the portion of the housing assembly 100 that defines the reference plane 101 and the lens 102 is positioned such that the focal plane 105 and the reference plane 101 coincide.

Figure 2:
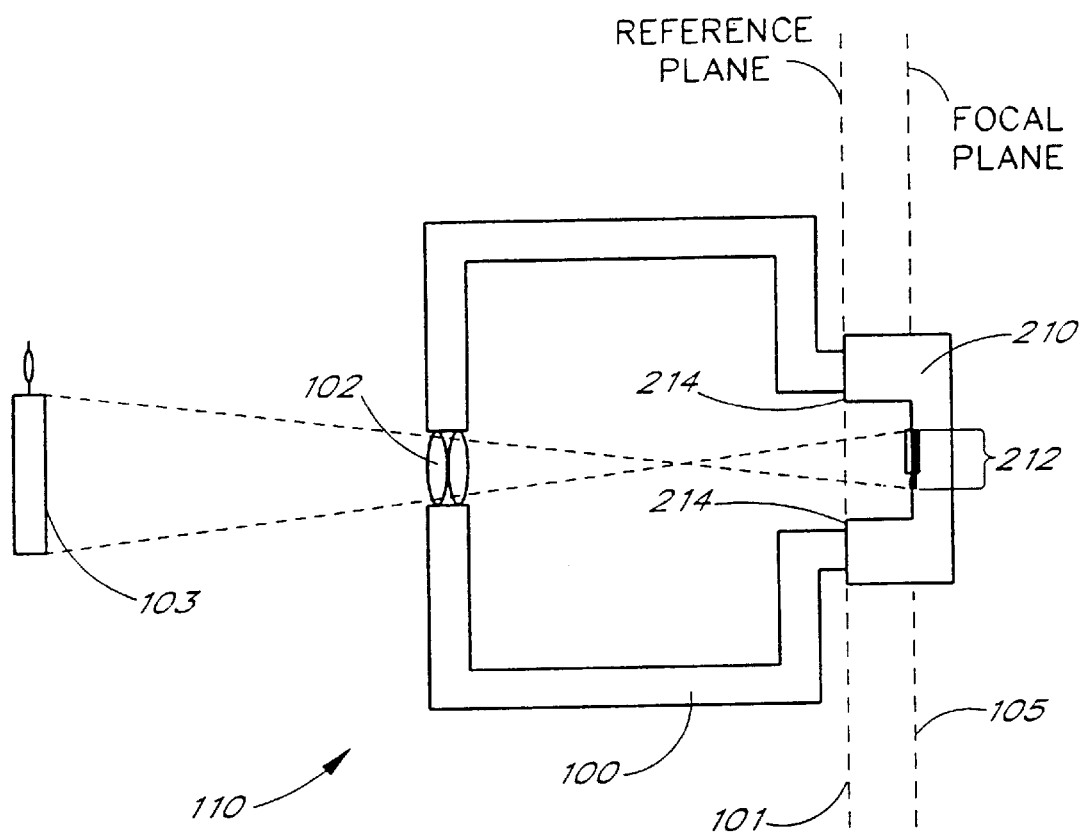
FIG. 2 shows the imaging system of FIG. 1 with an image sensor assembly mounted such that an image sensor is aligned with the focal plane.

FIG. 2 shows the imaging system 110 with an image sensor assembly 210 mounted on the housing assembly 100. The image sensor assembly 210 includes a sensor surface 212 and reference members 214. The reference members 214 are positioned with respect to the sensor surface 212 such that when the reference members are in contact with the portion of the housing 100 that defines the reference plane 101, the sensor surface 212 is desirably positioned with respect to the focal plane 105. In one embodiment, the reference members 214 are positioned with respect to the sensor surface 212 such that when the reference members are in contact with the portion of the housing 100 that defines the reference plane 101, the sensor surface 212 is very near the focal plane 105.

Figure 3:
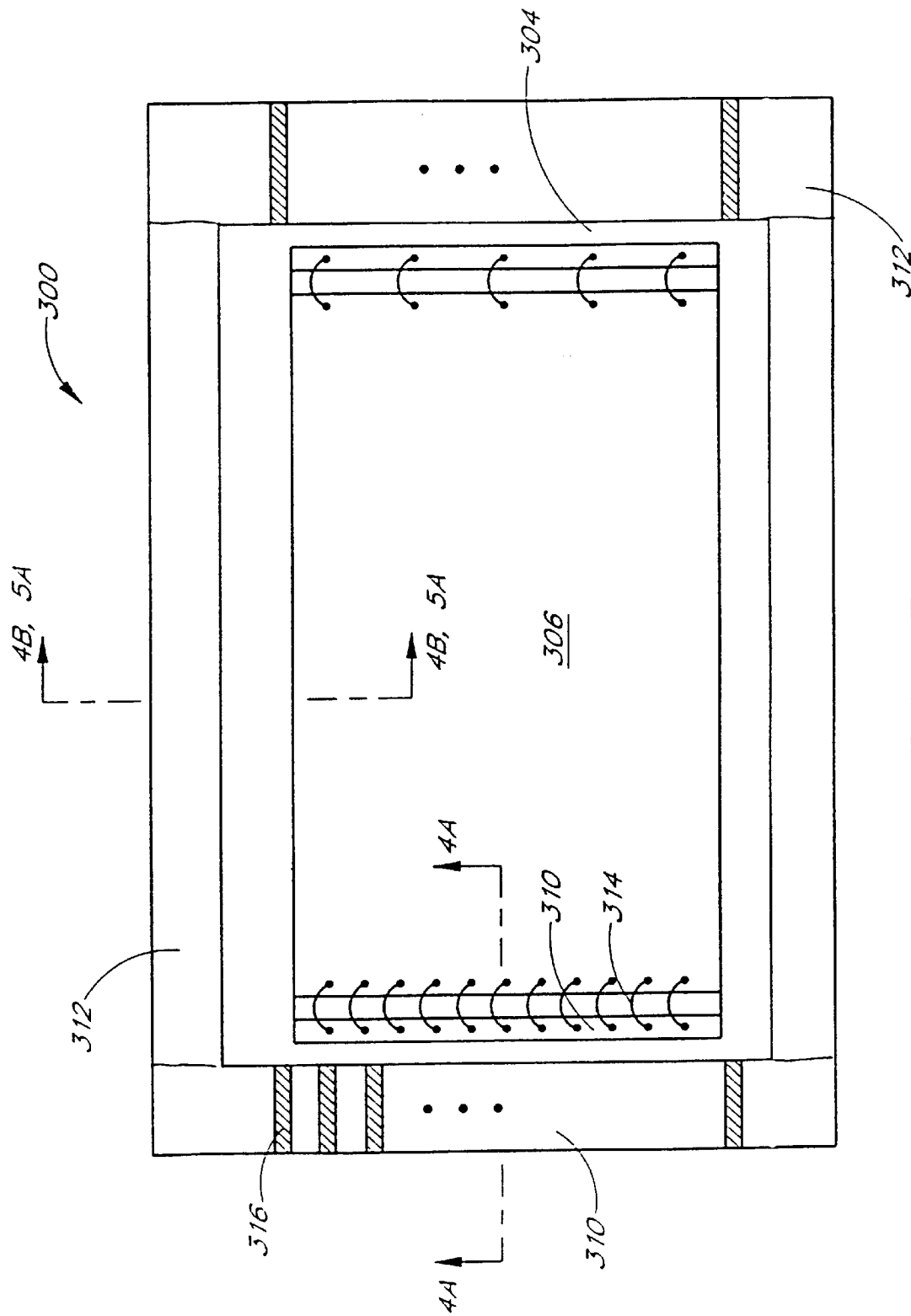
FIG. 3 shows a top view of an image sensor assembly.

FIG. 3 shows a top view of an image sensor assembly 300 that can be used as an embodiment of the image sensor assembly 210. The image sensor assembly 300 includes a window standoff frame 304 and a housing frame 310. The housing frame 310 can be constructed from any insulating material, including plastic, ceramic, glass, etc. The housing frame 310 includes one or more conductive members 316. The conductive members 316 can be surface mount pads, leads, pints for thru-hole mounting, J-leads, gull-wing leads, Flexsol ribbon connectors, edge metalization, leadless solder connections, ball grid array connectors, wire bond connectors, leadless conductive epoxy pads, z-axis elastomer pads, etc. One or more bond wires 314 provide electrical connection between the conductive members 316 and an integrated circuit sensor die 306. The bond wires 314 are positioned on left and right sides of the frame 310. Reference members 312 are provided on one or more portions of the housing frame 310. The reference members 312 may be attached (e.g., bonded) to the housing frame 310 or formed integrally with the frame 310.

Figure 4A:
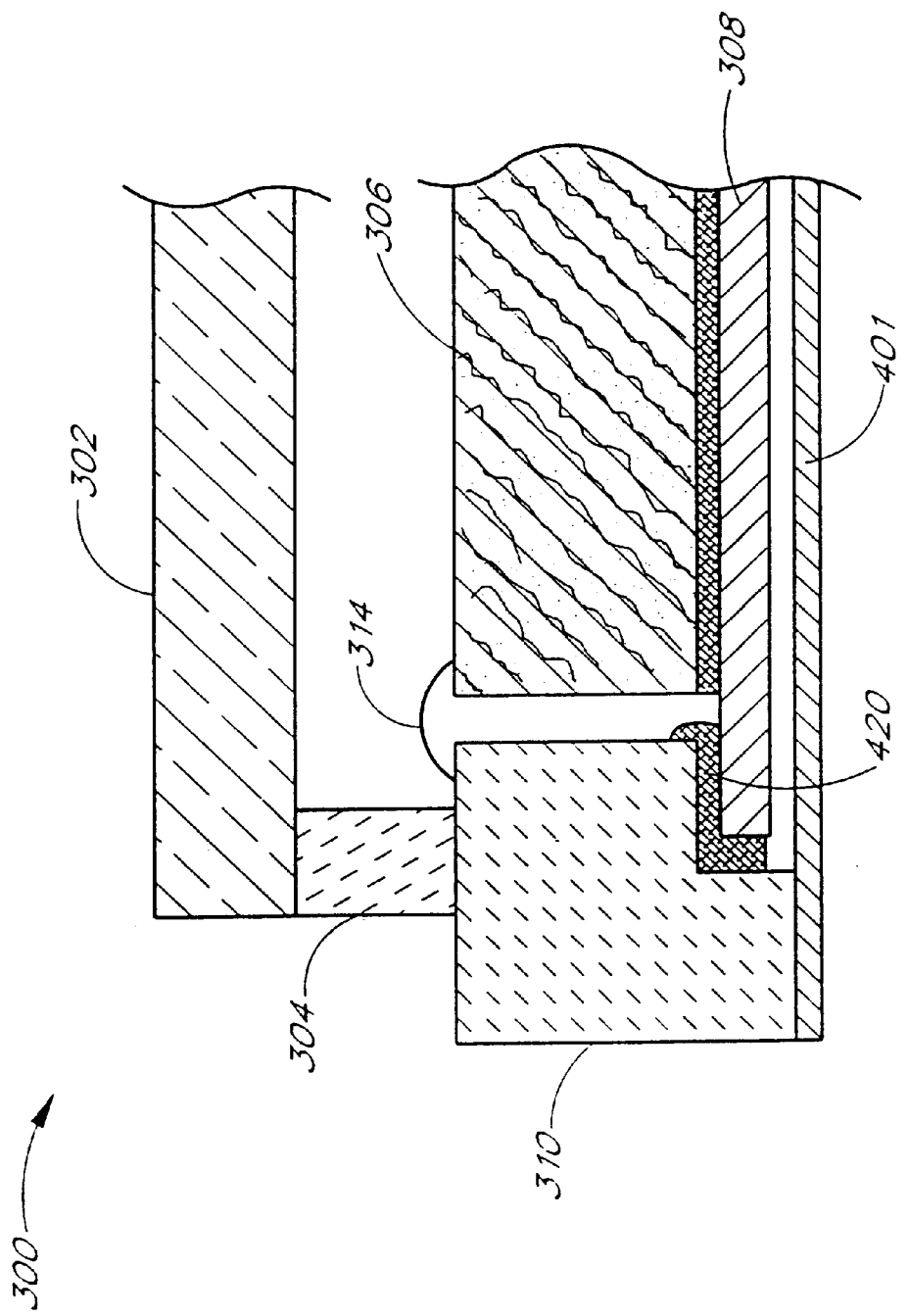
FIG. 4A, shows a cross section view of a cut-plane "A" from the image sensor assembly shown in FIG. 3.

FIG. 4A, shows a cross section view of a cut-plane "A" though a left (or right) side of the image sensor assembly 300 shown in FIG. 3. As shown in FIG. 4A, a lower portion of the window standoff frame 304 is bonded to an upper portion of the housing frame 310 and a window 302 is bonded to an upper portion of the window standoff frame 304. The window 302 is positioned over the die 306, thereby allowing light to reach an upper surface of the die 306. A lower surface of the die 306 is bonded to a plate 308. The plate 308 is rigid enough to support the die 306. In one embodiment, the plate 308 is a metal plate. The plate 308 is bonded to a lower portion of the frame 310 by an adhesive 420. The adhesive 420 can be an epoxy adhesive, an elastomeric adhesive, a resin adhesive, a cyano-acrylate adhesive, a thermoplastic adhesive, etc.

Figure 4B:
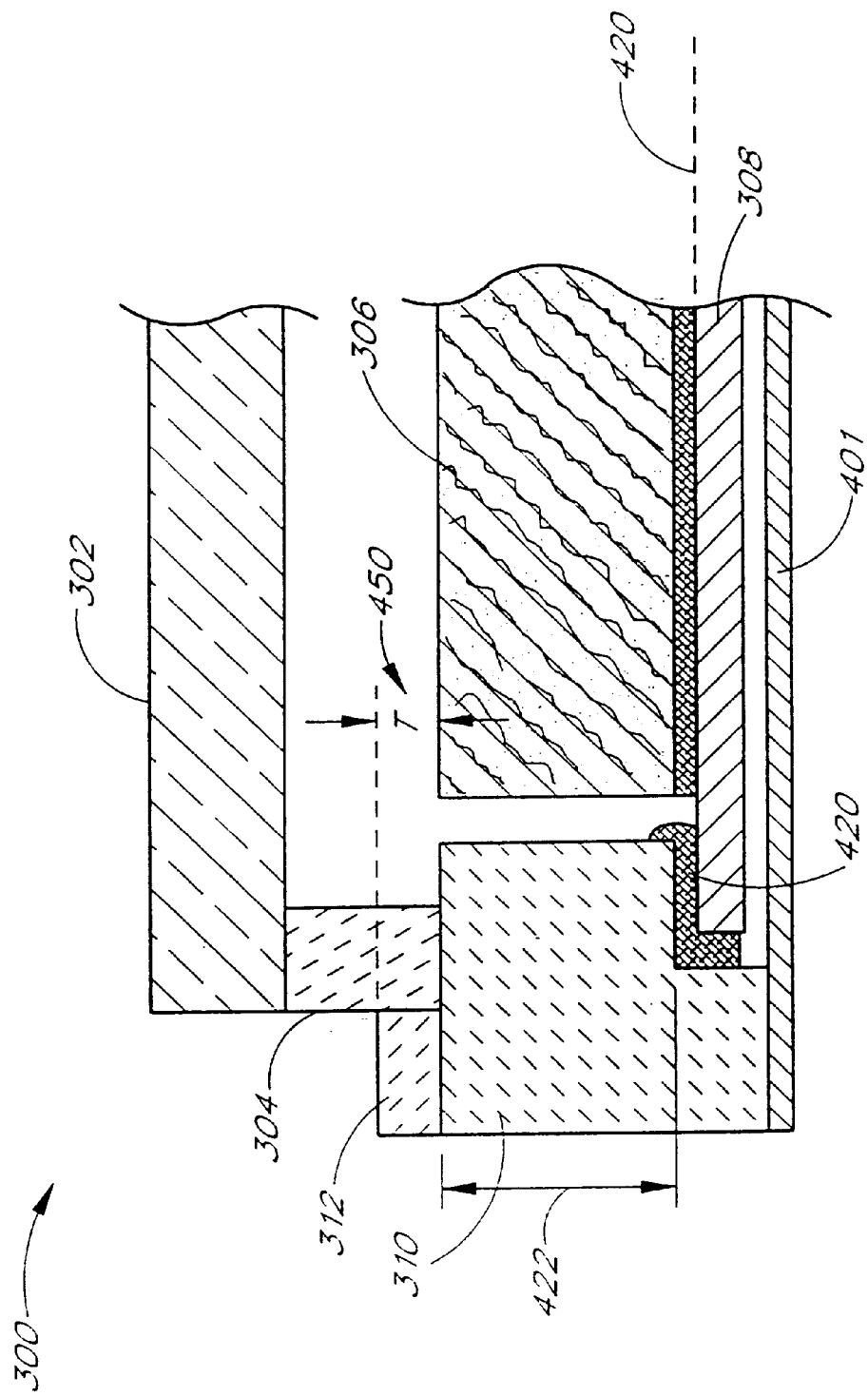
FIG. 4B shows a cross section view of a cut-plane "B" from the image sensor assembly shown in FIG. 3.

FIG. 4B shows a cross section view of a cut plane "B" through a top (or bottom) side of the image sensor assembly 300 shown in FIG. 3. As shown in FIG. 4B, an upper portion of the reference member 312 defines a reference plane substantially parallel to an image plane of the die 306. During construction of the image sensor assembly 300, a dimension T 450, between the reference plane and the upper surface of the die is held to a desired tolerance.

As used herein, the term image plane includes a plane in which a focused image is to be formed in order for the focused image to be sensed by the circuits on the image sensor die 306. Typically, it is desirable that when the image sensor die 306 is mounted in an optical system (such as that shown in FIG. 2), the image plane corresponds to the focal plane of the lens 102. The image plane of the image sensor die 306 is typically a known distance from, and coplanar with, the upper surface of the die. For many image sensor dies, the image plane corresponds to the upper surface of the die 306 having light sensing elements thereon. However, the presence of micro-lenses attached to the image sensor die 306 and/or a window or lens (such as, for example the window 302) can move the image plane away from the upper surface of the die 306. Nevertheless, the distance between the image plane and the upper surface of the die is typically known, such that by mounting the upper surface of the image sensor die 302 with reference to a reference plane, the image plane is thereby positioned at a predictable distance with respect to the reference plane.

The tolerance T 450 can be provided by machining the reference member 312 after the plate 308 (carrying the die 306) is bonded to the frame 310. Alternatively, the tolerance T 450 can be provided by bonding the plate 308 (carrying the die 306) to the frame 310 using a jig (not shown) such that the sensor surface is held in a desired position relative to the reference plane during the bonding process. Once the plate 308 is bonded to the frame 310, the spacing T 450 is controlled primarily by thermal expansion of the thickness of the die 306, the plate 308, the bond line between the die 306 and the plate 308, the adhesive 420, a shoulder region 422 of the frame 310, and the reference member 312.

An optional lower cover 401 can be bonded to a lower surface of the frame 310 to further protect the die 306 and the plate 308.

Figure 5A:
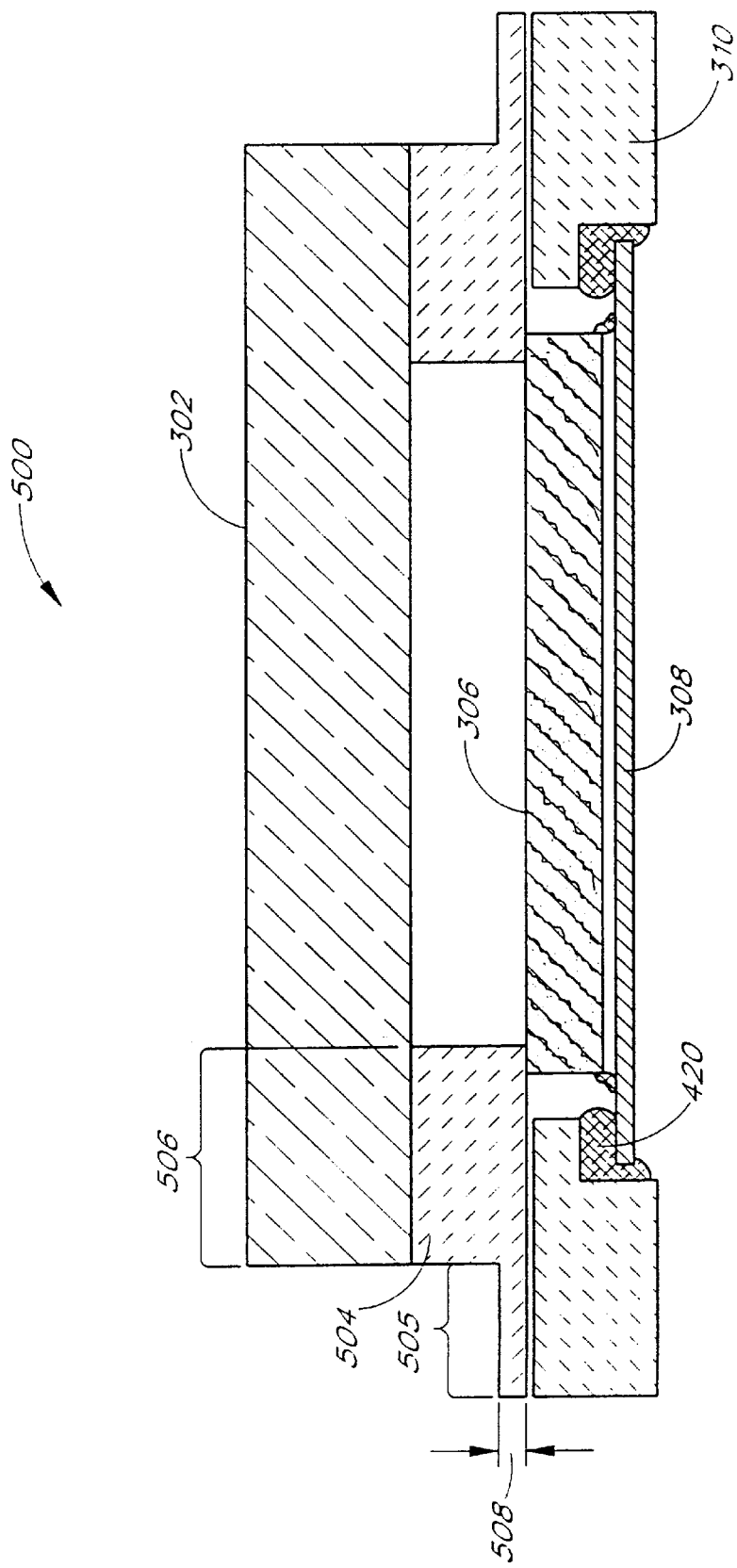
FIG. 5A shows a cross section view of an image sensor assembly wherein the reference members are incorporated into the window standoff frame.

FIG. 5A shows a cross section view of an image sensor assembly 500 wherein a reference member that establishes a reference plane is incorporated into a window standoff frame 504. In the assembly 500, a first upper portion 506 of the window standoff frame 504 supports the window 302. A second upper portion 505 of the window standoff frame 504 establishes the reference plane. The window standoff frame 504 is bonded to the frame 310. The die 306 is bonded to the plate 308 and the plate is bonded to the frame 310 by an adhesive 420. When bonded, the upper surface of the die 306 (the upper surface having the image sensor) is in close proximity, or actual contact, with a lower surface of the window standoff frame 504.

A thickness T 508 between the second upper surface 505 and the lower surface of the window standoff frame 504 determines the spacing between the reference plane (established by the second upper surface 505) and the surface of the image sensor die 306. Thus, the thickness of the image sensor die 306 does not affect the spacing or alignment between the reference plane and the image plane of the sensor. Moreover, the mechanical tolerances of the plate 308, the bond 420, and the lower frame 310 do not affect the spacing or alignment of between the reference plane and the image plane of the sensor.

Figure 5B:
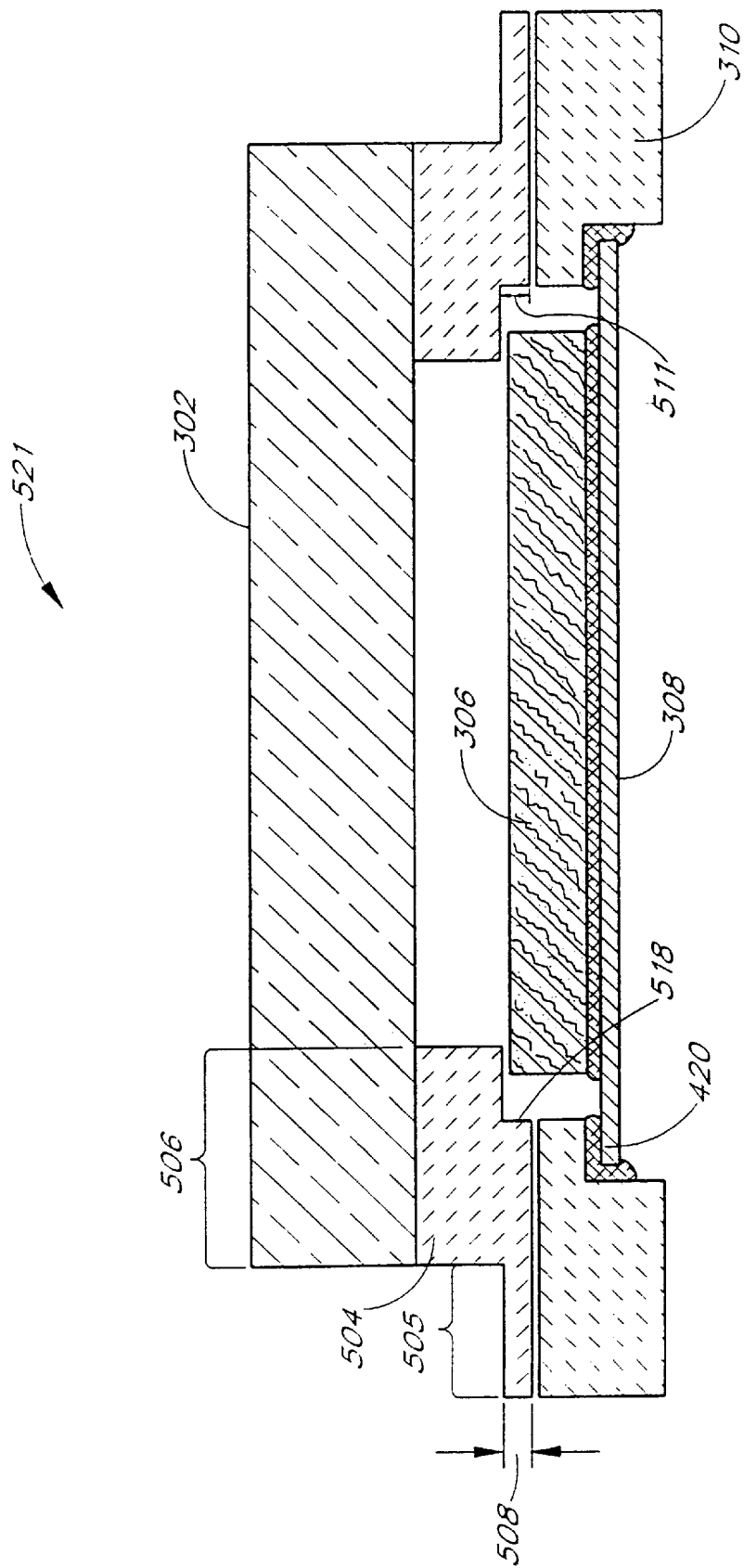
FIG. 5B shows a cross section view of an image sensor assembly wherein the reference members are incorporated into the window standoff frame, the image sensor die sits in a recessed shoulder in the window standoff frame, and the back plate is bonded to a lower frame.

FIG. 5B shows a cross section view of an image sensor assembly 510 that is similar to the assembly 500, except that the image sensor die 306 rests against a recessed standoff shoulder 518. The recessed standoff shoulder 518 is recessed by a recess thickness 511. The plate 308 is bonded to the frame 310. The distance between the top surface of the image sensor die 306 and the reference plane is determined primarily by the difference between the recess thickness 511 and the thickness T 508. The assembly 510 allows the top surface of the image sensor die 306 to be placed in the reference plane or even above the reference plane as desired. By adjusting the dimensions 508 and 511, the image plane can be placed in front of the reference plane, coincident with the reference plane, or behind the reference plane, as desired.

Figure 5C:
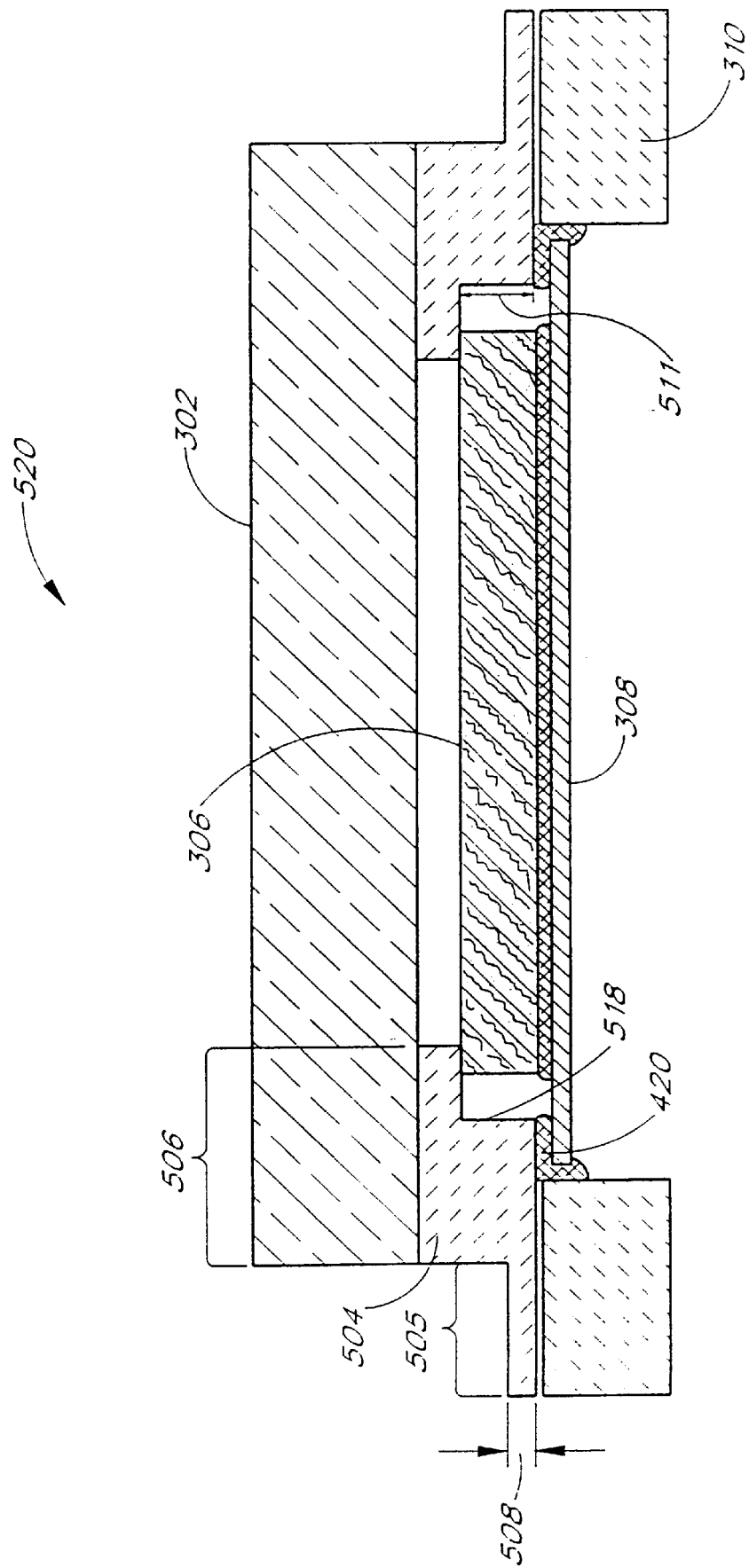
FIG. 5C shows a cross section view of an image sensor assembly wherein the reference members are incorporated into the window standoff frame, the image sensor die sits in a recessed shoulder in the window standoff frame, and the back plate is bonded to the window standoff frame.

FIG. 5C shows a cross section view of an image sensor assembly 520 that is similar to the assembly 510, except that the plate 308 is bonded to the window standoff frame 504.

Figure 5D:
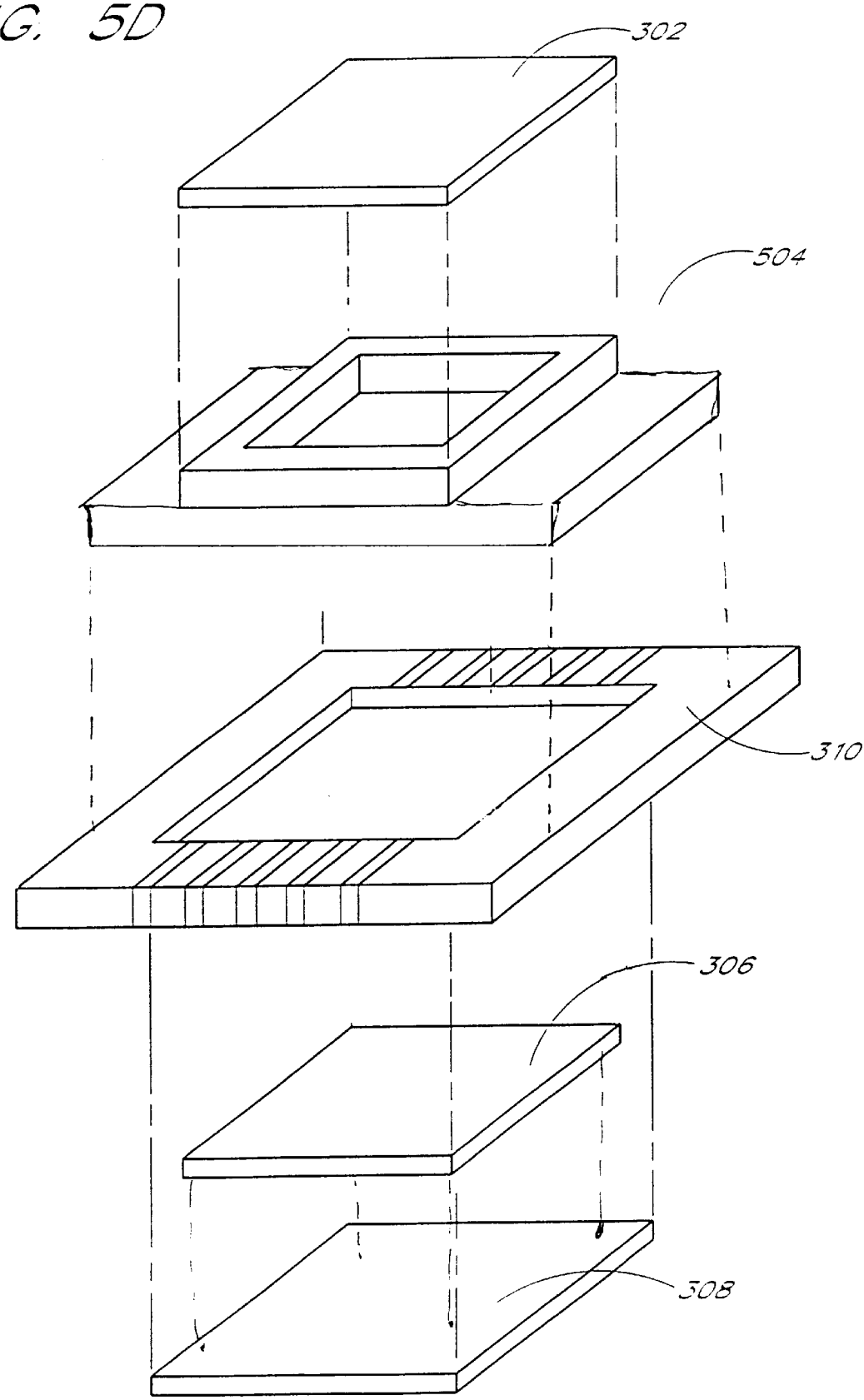
FIG. 5D shows an exploded view of the image sensor assembly shown in FIGS. 5A–5C.

FIG. 5D shows an exploded view of the assemblies illustrated in FIGS. 5A–5C.

One skilled in the art will recognize that the thickness T 508 can be reduced to zero in FIGS. 5A–5C such that the reference member is a portion of the upper surface of the frame 310. However, in that instance, the spacing and alignment between the reference plane and the image plane will be a function of the thickness of the bond line between the window standoff frame 504 and the frame 310.

The optional second cover 401 can be bonded to a lower surface of the frame 310 shown in FIGS. 5A–5C. In other respects, the image sensor assemblies 500, 510, and 520 are similar to the image sensor assemblies shown in FIGS. 3 and 4.

Figure 6A:
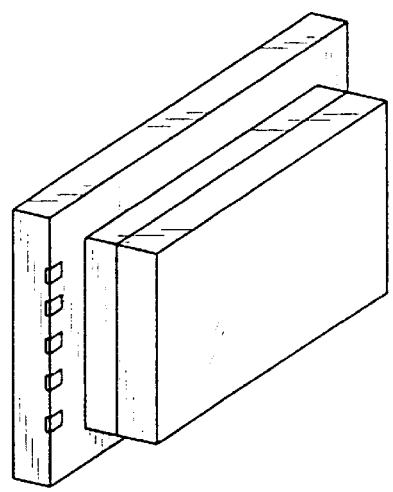
FIG. 6A shows reference members where the reference plane is established by one or more upper surfaces.
Figure 6B:
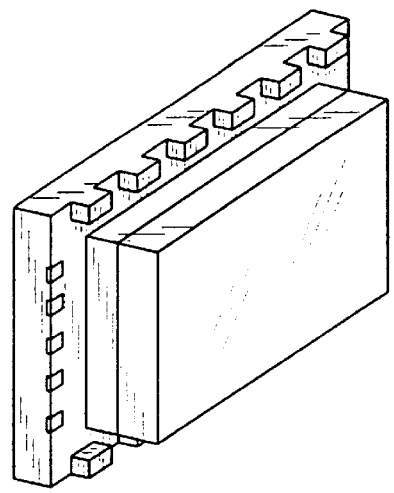
FIG. 6B shows reference members where the reference plane is established by pads on an upper surface of the reference members.
Figure 6C:
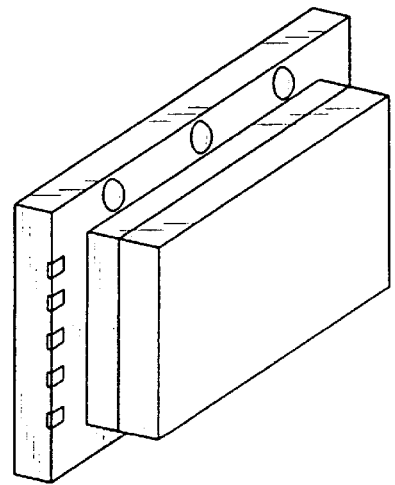
FIG. 6C shows reference members where the reference plane is established by protrusions on an upper surface of the reference members.

FIGS. 6A–6C show various embodiments of the reference members described in FIGS. 3–5. In FIG. 6A, the reference plane is established by a substantially planar smooth upper surface 602 of the reference member. In FIG. 6B, the reference plane is established by a plurality of pads 608 formed on an upper surface of the reference member. Each pad 608 has a surface that is substantially planar. The shape of the pads 608 can be rectangular, circular, triangular, oval, trapezoidal, linear, rail-like, etc. In FIG. 6C, the reference plane is established by a plurality of protrusions 628 provided on an upper surface of the reference member. The protrusions 628 can be hemispherical, conical, truncated-conical, etc.

Figure 7A:
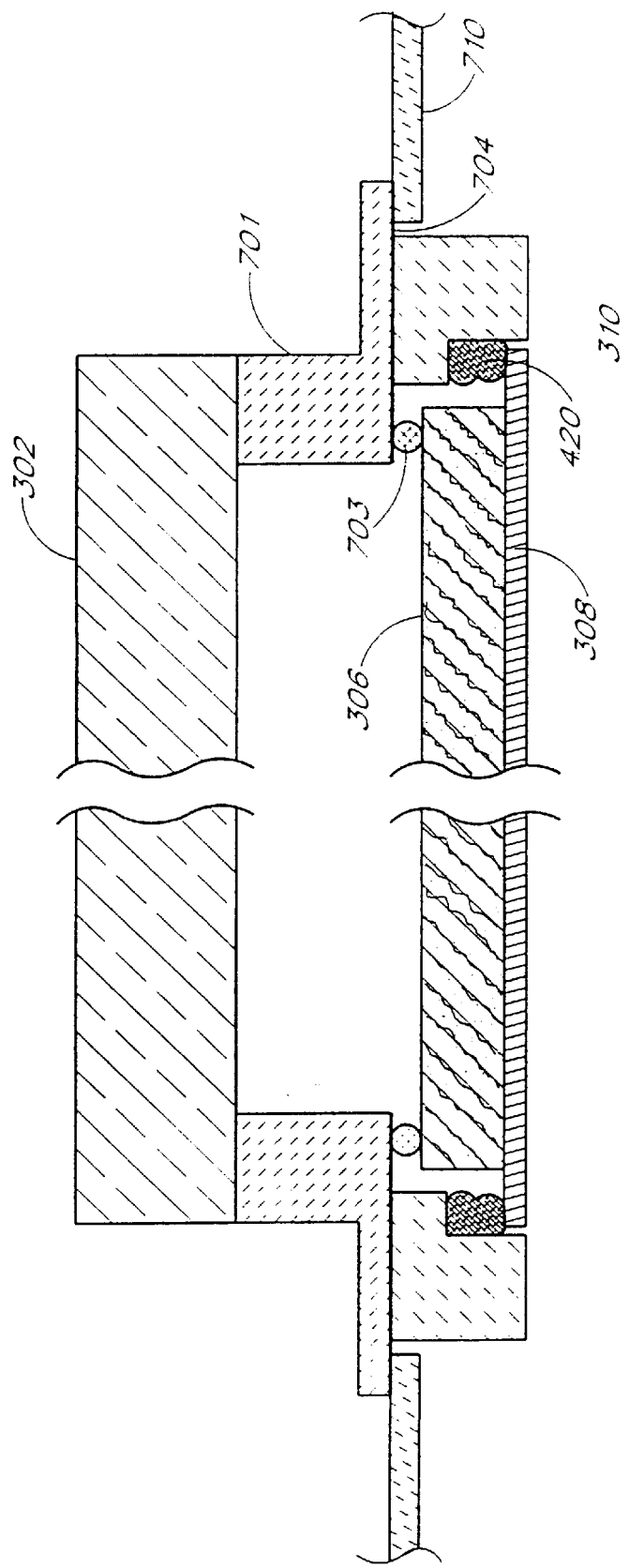
FIG. 7A shows a cross section view of an image sensor assembly wherein the image sensor die is electrically connected to an upper frame.
Figure 7B:
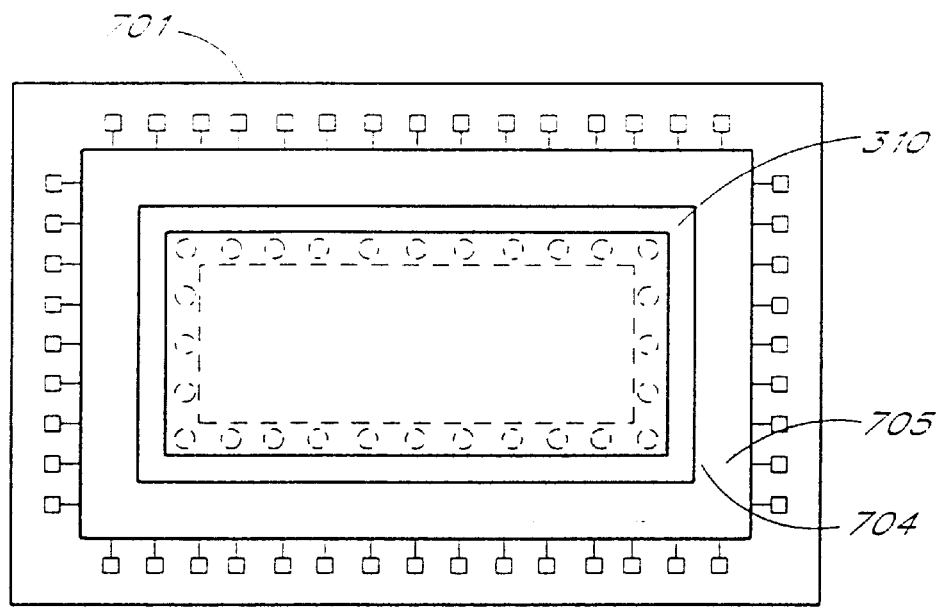
FIG. 7B shows an underside (connector side) view of the assembly shown in FIG. 7A.
Figure 7C:
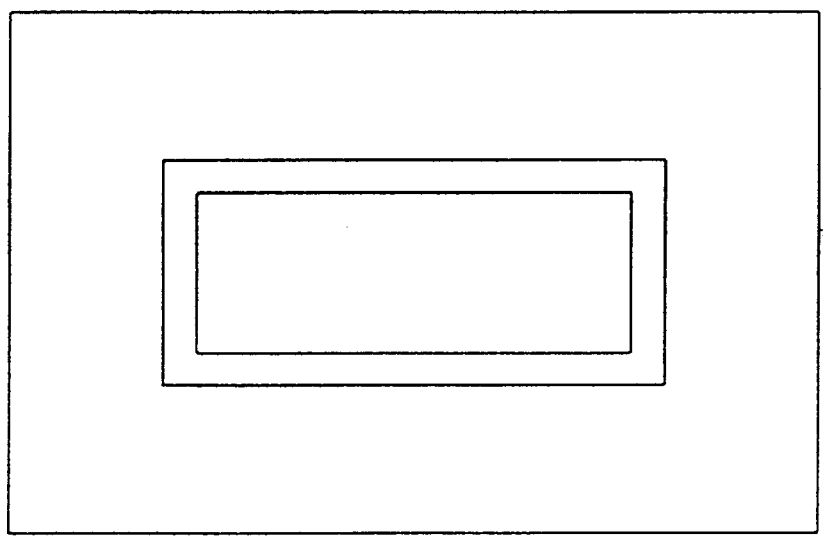
FIG. 7C shows an upper side (window side) view of the assembly shown in FIG. 7A.
Figure 7D:
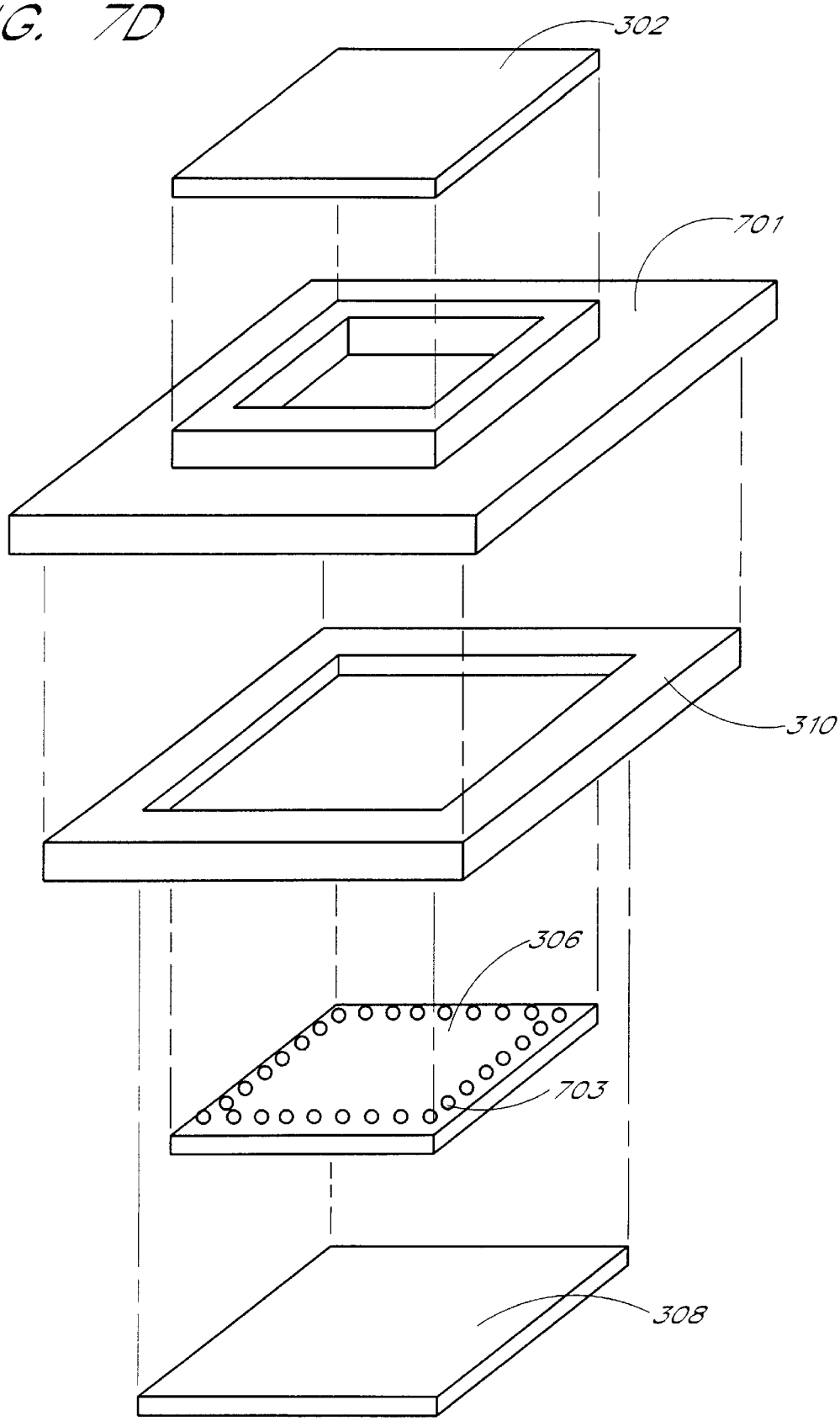
FIG. 7D shows an exploded view of the assembly shown in FIGS. 7A–7C.

FIG. 7A shows a cross section view of an image sensor assembly 700 wherein the image sensor die is electrically connected to an upper frame. FIG. 7B shows an underside view of the assembly 700, FIG. 7C shows a top side view of the assembly 700, and FIG. 7D shows an exploded view of the assembly 700. In the assembly 700, a first upper portion of a window standoff frame 701 supports the window 302. A second upper portion of the window standoff frame 701 establishes the reference plane. The window standoff frame 701 is bonded to the frame 310. The die 306 is bonded to a plate 308 and the plate is bonded to the frame 310 by an adhesive 420. When bonded, the upper surface of the die 306 (the upper surface having the image sensor) is in close proximity, or actual contact, with a lower surface of the window standoff frame 701. An electrical contact 703 connects an electrical lead (or pad) on the upper surface of the die 306 to an electrical trace 704 on the lower surface of the window frame 701 (as shown in FIG. 5B). The trace 704 ends in an electrical pad 705. As shown in FIGS. 7A and 7B, many such connections can be provided between the die 306 and pads on the window frame 701. The pads on the window frame can be provided on one, two, three, or four sides of the window frame 701. FIG. 7B shows electrical pads on all four sides of the window frame 701. The pads, such as the pad 705, can be electrically connected to a circuit board or flexible circuit 710 as shown.

The electrical contact 703 can be, for example, a flip chip connection, a Tape-Automated Bond (TAD), and the like. Examples of flip chip connections include solder connections, conductive adhesives, gold pads, conductive polymer bumps, etc.

While certain specific embodiments of the present invention have been described, these embodiments have been presented by way of example only, and are not intended to limit the scope of the present invention. One skilled in the art will recognize that the orientations "upper", "lower", etc are used as a matter of convenience and to be consistent with the illustrations; but not by way of limitation. Accordingly, the breadth and scope of the present invention should be defined only in accordance with the following claims and their equivalents.

What is claimed is:

1. An integrated circuit package for housing an integrated circuit die, said package providing a reference plane in relation to an image plane of said die, said package comprising:

a transparent window;

a lower frame; and an upper frame bonded to said lower frame, said lower frame configured as a main housing with wiring traces on a front side and a recessed shelf for receiving a recessed cover on a rear side, said upper frame configured as a standoff for said transparent window, said upper frame configured to provide a stopping surface for positioning an integrated circuit die.

2. The integrated circuit package of claim 1, further comprising a back cover plate.

3. The integrated circuit package of claim 2, further comprising:

a gap between said back cover plate and said lower frame; and an adhesive in said gap.

4. The integrated circuit package of claim 1 further comprising reference members integral to said upper frame, said reference members defining a reference plane with respect to said stopping surface.

5. The integrated circuit package of claim 1 further comprising reference members attached to said upper frame, said reference members defining a reference plane with respect to said stopping surface.

6. The integrated circuit package of claim 1, wherein said window is configured as a lens.

7. The integrated circuit package of claim 1, wherein an image plane of an optical system comprising an integrated circuit sensor die and said transparent window is aligned with respect to a said reference plane.

8. An integrated circuit package for housing an integrated circuit die, said package providing a reference plane in relation to an image plane of said die, said package comprising:

a transparent window; and a frame having an upper surface and a lower surface, said lower surface having a recessed shelf for receiving a recessed cover, a first portion of said upper surface configured as a standoff for said window, a portion of said lower surface configured as a stopping surface, a second portion of said upper surface configured as a first reference member, and a third portion of said upper surface configured as a second reference member.

9. The integrated circuit package of claim 8, wherein said first and second reference members define a reference plane.

10. The integrated circuit package of claim 9, wherein said reference plane is parallel to a plane defined by said stopping surface.

11. The integrated circuit package of claim 8, wherein said window is configured as a lens.

12. The integrated circuit package of claim 8, further comprising a rear cover.

13. The integrated circuit package of claim 8, wherein said frame includes one or more conductive traces on at least a portion of said lower surface, said electrical traces configured to be electrically connected to an integrated circuit die.

14. The integrated circuit package of claim 13, wherein said one or more electrical traces are configured to be connected to an integrated circuit die by flip chip connections.

15. The integrated circuit package of claim 13, wherein said one or more electrical traces are configured to be connected to an integrated circuit die by tape-automated bonds.

* * * * *